(12) United States Patent
Kim et al.

(10) Patent No.: US 7,419,909 B2
(45) Date of Patent: Sep. 2, 2008

(54) METHODS OF FORMING A SEMICONDUCTOR DEVICE THAT ALLOW PATTERNS IN DIFFERENT REGIONS THAT HAVE DIFFERENT PITCHES TO BE CONNECTED

(75) Inventors: Jin-Ho Kim, Gyeonggi-do (KR); Jae-Kwan Park, Gyeonggi-do (KR); Dong-Hwa Kwak, Gyeonggi-do (KR); Su-Jin Ahn, Seoul (KR); Yoon-Moon Park, Seoul (KR); Jue-Hwang Sim, Seoul (KR); Jang-Ho Park, Gyeonggi-do (KR); Sang-Yong Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 75 days.

(21) Appl. No.: 11/647,722

(22) Filed: Dec. 29, 2006

(65) Prior Publication Data
US 2008/0085581 A1    Apr. 10, 2008

(30) Foreign Application Priority Data
Oct. 10, 2006    (KR) ..................... 10-2006-0098579

(51) Int. Cl.
*H01L 21/302* (2006.01)
(52) U.S. Cl. ........... 438/691; 257/E21.58; 257/E21.244
(58) Field of Classification Search .................. 438/138, 438/241, 234
See application file for complete search history.

(56) References Cited

U.S. PATENT DOCUMENTS 6,596,578 B2 *    7/2003    Takeuchi et al. ............ 438/241

FOREIGN PATENT DOCUMENTS

| KR | 10-1995-0001914 | 1/1995 |
|---|---|---|
| KR | 10-0181749 | 9/1998 |
| KR | 10-2005-0002311 | 1/2005 |

* cited by examiner

*Primary Examiner*—Scott B. Geyer
*Assistant Examiner*—Kyoung Lee
(74) *Attorney, Agent, or Firm*—Myers Bigel Sibley & Sajovec, P.A.

(57) ABSTRACT

Patterns are formed in a semiconductor device by defining a lower layer that includes a first region and a second region on a semiconductor substrate, forming first patterns with a first pitch that extend to the first and second regions, forming second patterns with a second pitch in the second region that are alternately arranged with the first patterns, forming a space insulating layer that covers the first and second patterns and comprises gap regions that are alternately arranged with the first patterns so as to correspond with the second patterns, forming third patterns that correspond to the second patterns in the gap regions, respectively, etching the space insulating layer between the first and second patterns and between the first and third patterns, such that the space insulating layer remains between the second patterns and the third patterns, and etching the lower layer using the first, second, and third patterns and the remaining space insulating layer between the second and third patterns as an etching mask.

14 Claims, 18 Drawing Sheets

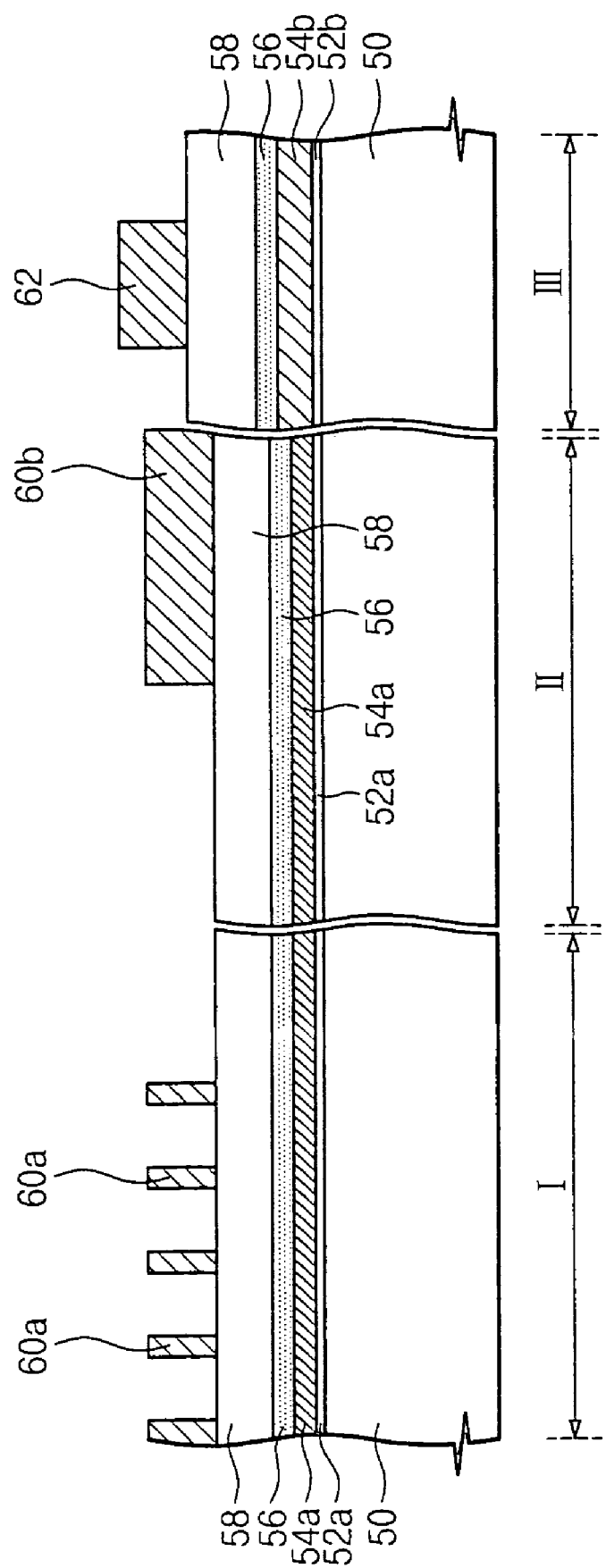

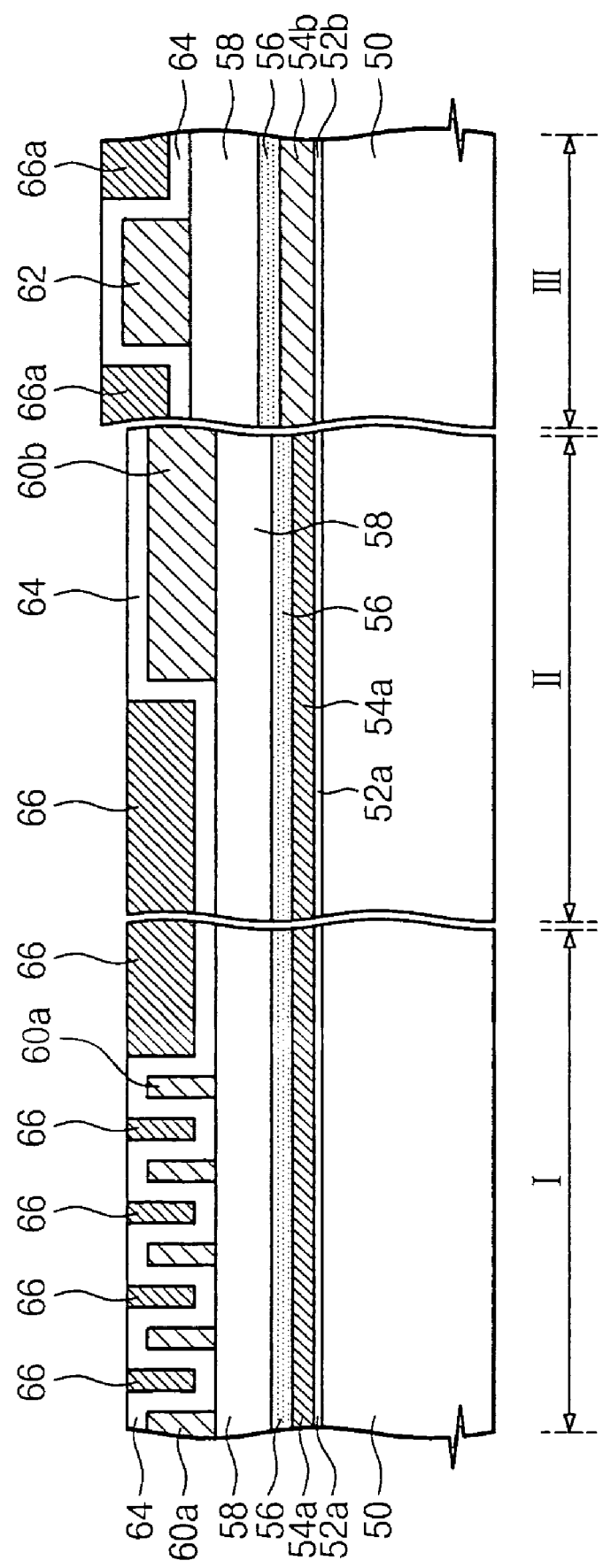

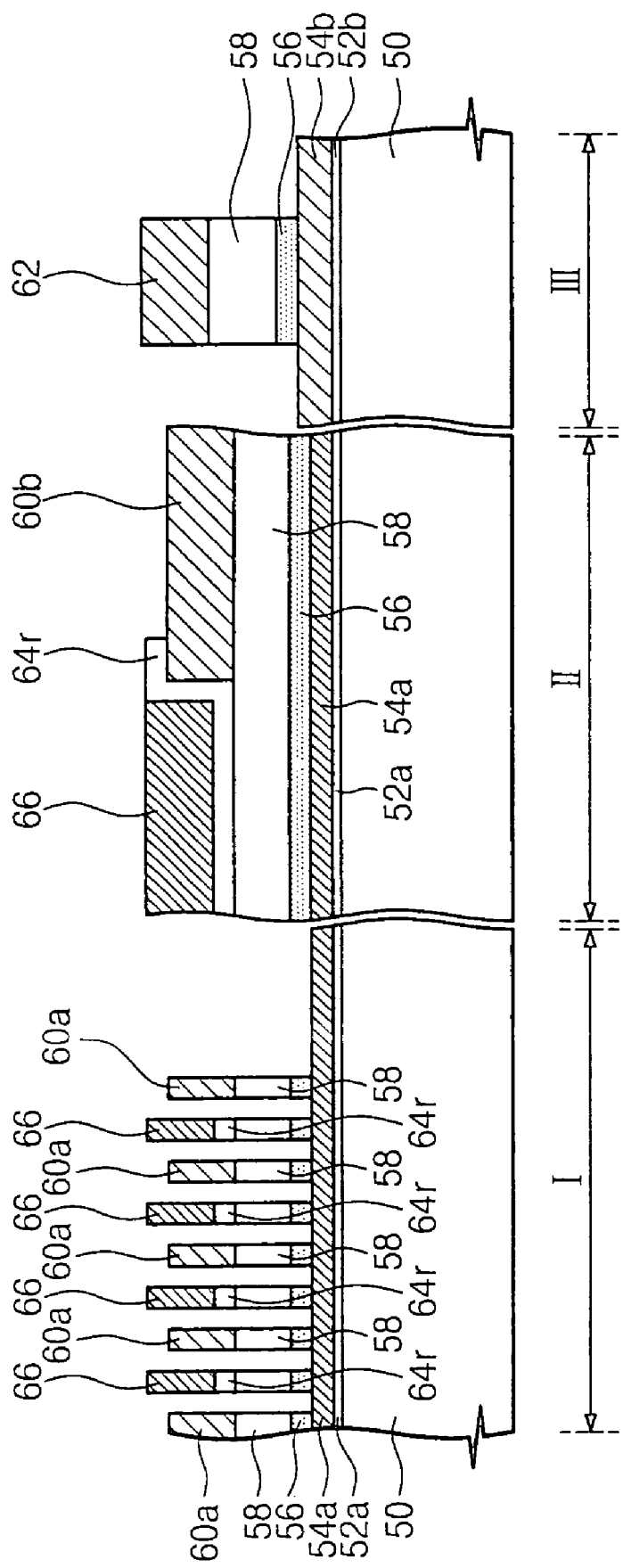

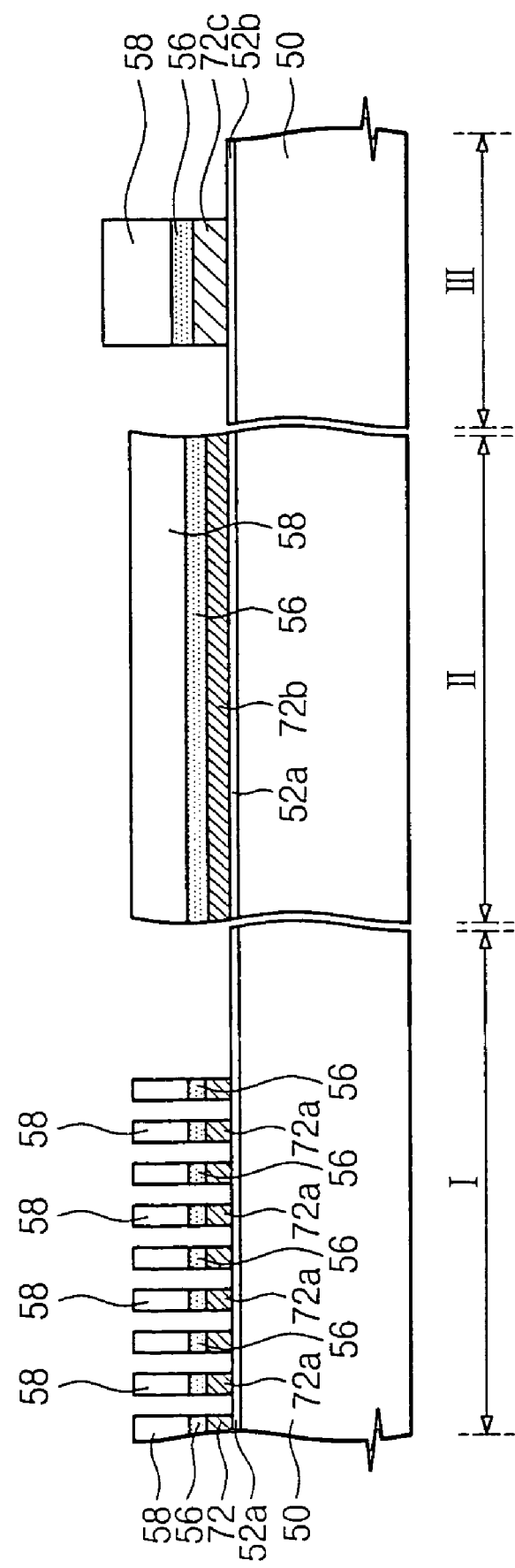

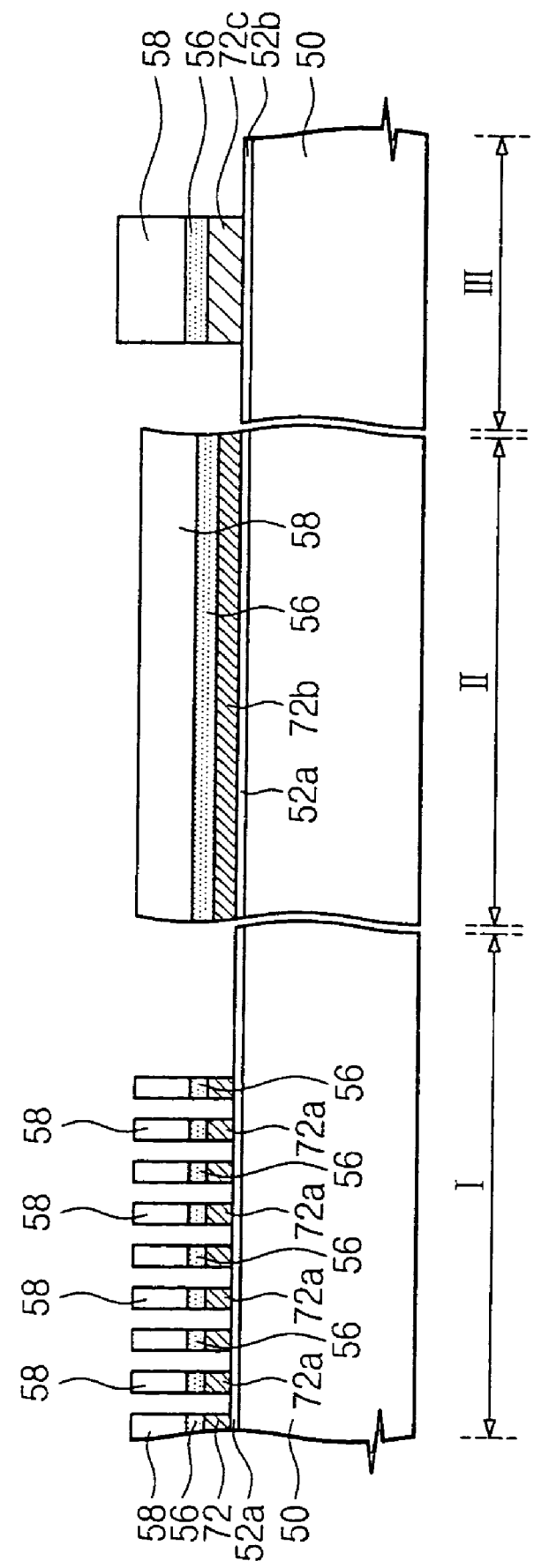

METHODS OF FORMING A SEMICONDUCTOR DEVICE THAT ALLOW PATTERNS IN DIFFERENT REGIONS THAT HAVE DIFFERENT PITCHES TO BE CONNECTED

CROSS-REFERENCE TO RELATED APPLICATION

This U.S. non-provisional patent application claims priority under 35 U.S.C. § 119 to Korean Patent Application No. 2006-98579, filed on Oct. 10, 2006, the entire contents of which are hereby incorporated by reference.

BACKGROUND OF THE INVENTION

The present invention disclosed herein relates to semiconductor devices, and, more particularly, to methods of forming patterns in semiconductor devices.

With a tendency toward a higher integration of semiconductor devices, a technique that is capable of forming patterns having fine sizes beyond an exposure limit may be desirable. Recently, a self aligned double patterning (SADP) technique has been developed, in which first patterns are formed and then second patterns are formed therebetween so that pitches of the patterns can be reduced.

Patterns formed in a cell region of a semiconductor memory device typically have small pitches, while patterns formed in a peripheral circuit region are typically larger than those of the cell region.

When SADP is used to form the cell region and the peripheral circuit region, additional time and effort may be required to design the peripheral circuit region as it is typically more complicated. Often, a peripheral circuit that is designed using SADP may be re-analyzed and corrected according to the results of the analysis.

SUMMARY OF THE INVENTION

Patterns are formed in a semiconductor device, according to some embodiments of the present invention, by defining a lower layer that includes a first region and a second region on a semiconductor substrate, forming first patterns with a first pitch that extend to the first and second regions, forming second patterns with a second pitch in the second region that are alternately arranged with the first patterns, forming a space insulating layer that covers the first and second patterns and comprises gap regions that are alternately arranged with the first patterns so as to correspond with the second patterns, forming third patterns that correspond to the second patterns in the gap regions, respectively, etching the space insulating layer between the first and second patterns and between the first and third patterns, such that the space insulating layer remains between the second patterns and the third patterns, and etching the lower layer using the first, second, and third patterns and the remaining space insulating layer between the second and third patterns as an etching mask.

In other embodiments, the lower layer comprises a charge trap insulating layer and a first gate layer that is formed on the charge trap insulating layer.

In still other embodiments, the first gate layer comprises a metal nitride layer.

In still other embodiments, the first gate layer comprises a tantalum nitride layer that is formed on the charge trap insulating layer.

In still other embodiments, the first region is a cell array region and the second region is a decoder region that is adjacent to the cell array region. The lower layer comprises a charge trap insulating layer and a first gate layer that is formed on the charge trap insulating layer.

In still other embodiments, the method further comprises forming a mask insulating layer on the lower layer before forming the first and second patterns, forming etch mask patterns that cover the space insulating layer between the second and third patterns before etching the space insulating layer, and etching the space insulating layer and the mask insulating layer using the etch mask patterns and the first, second, and third patterns as an etch mask so as to form mask insulating layer patterns.

In still other embodiments, the mask insulating layer patterns comprise alternately arranged first and second insulating layers, the first insulating layers corresponding to the first patterns and the second insulating layers corresponding to a structure of which the second and third patterns are connected.

In still other embodiments, the method further comprise defining a third region on the semiconductor substrate. A lower layer of the third region comprises a gate insulating layer and a second gate layer that is formed on the gate insulating layer.

In still other embodiments, the method further comprises forming fourth patterns on the third region. The first, second, third, and fourth patterns comprise a same material as the second gate layer.

In still other embodiments, etching the space insulating layer and the mask insulating layer comprises etching the space insulating layer and the mask insulating layer using the etch mask patterns and the first, second, third, and fourth patterns as an etch mask so as to form the mask insulating layer patterns, and etching the second gate layer together with the first, second, third, and fourth patterns so as to form gate electrodes that are aligned with the mask insulating layer patterns under the fourth patterns.

In still other embodiments, the method further comprises, before forming the first and second patterns forming a mask insulating layer on the lower layer, forming a mask pattern layer on the mask insulating layer, and forming recess regions in the mask pattern layer corresponding to end portions of the second patterns, such that the mask pattern layer has a recess thickness in the recess regions. Etching the space insulating layer comprises etching the mask pattern layer so as to form the second patterns such that the first patterns and the end portions of the second patterns are recessed to the recess thickness.

In still other embodiments, forming the third patterns comprises forming the third patterns such that the third patterns overlap the end portions of the second patterns.

In still other embodiments, the method further comprises etching the mask insulating layer to form mask insulating layer patterns, the mask insulating layer patterns comprising alternately arranged first and second insulating layer patterns, the first insulating layer patterns being self-aligned with the first patterns, and the second insulating layer patterns being self-aligned with a structure of which the second and third patterns are connected.

In still other embodiments, etching the space insulating layer comprises etching the space insulating layer between end portions of the second patterns and the third patterns until reaching the overlap of the third patterns with the end portions of the second patterns.

BRIEF DESCRIPTION OF THE DRAWINGS

Other features of the present invention will be more readily understood from the following detailed description of exemplary embodiments thereof when read in conjunction with the accompanying drawings, in which:

FIGS. 3A-3G are cross-sectional views that further illustrate the methods of forming patterns in a semiconductor device of FIGS. 2A-2D;

FIGS. 5A-5D are cross-sectional views that further illustrate the methods of forming patterns in a semiconductor device of FIGS. 4A-4B.

DETAILED DESCRIPTION

Figure 1:
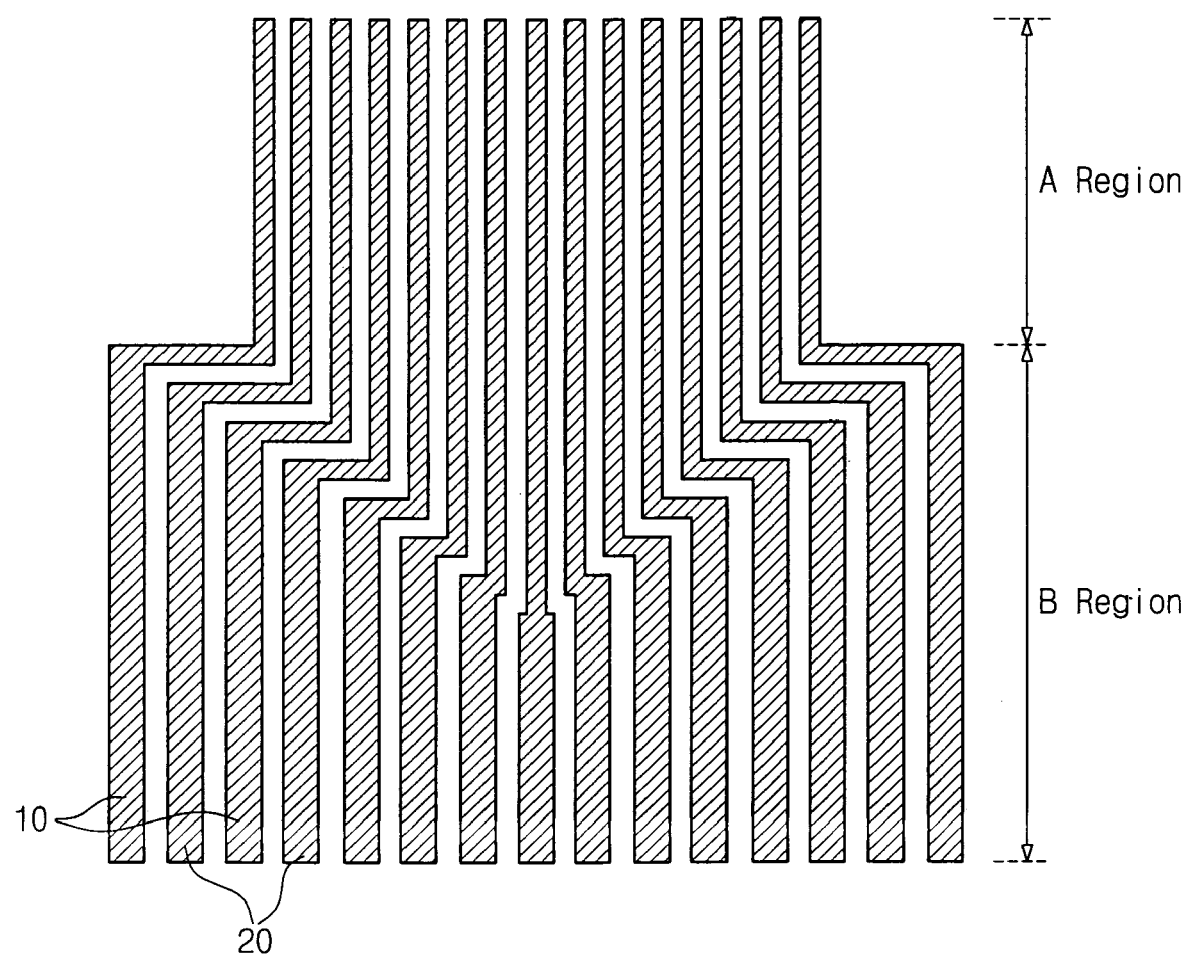
FIG. 1 is a plan view that illustrates wiring in a semiconductor device according to some embodiments of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. It will be understood that when an element is referred to as being "connected" or "coupled" to another element, it can be directly connected or coupled to the other element or intervening elements may be present. In contrast, when an element is referred to as being "directly connected or coupled" to another element, there are no intervening elements present. Furthermore, "connected" or "coupled" as used herein may include wirelessly connected or coupled. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures were turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

In the description, a term "substrate" used herein may include a structure based on a semiconductor, having a semiconductor surface exposed. It should be understood that such a structure may contain silicon, silicon on insulator, silicon on sapphire, doped or undoped silicon, epitaxial layer supported by a semiconductor substrate, or another structure of a semiconductor. And, the semiconductor may be silicon-germanium, germanium, or germanium arsenide, not limited to silicon. In addition, the substrate described hereinafter may be one in which regions, conductive layers, insulation layers, their patterns, and/or junctions are formed.

FIG. 1 is a plan view that illustrates an interface region where patterns with different pitches are connected. A semiconductor device may have patterns of different pitches according region. In the case of a memory device, the pitches arranged in a cell region and a peripheral circuit region may have substantially different lengths. For example, a cell region where the widths and the pitches of the patterns may be relatively small to achieve high integration may be defined a region A, and an interface region (i.e., decoder region) for connecting the cell region to the peripheral circuit region may be defined as a region B.

When the widths and the pitches of the patterns of the A region are sufficiently large, a first pattern set 10 and a second pattern set 20 may be patterned at the same time. However, as the widths and the pitches of the patterns are reduced, it may be difficult to pattern the first pattern set 10 and the second pattern set 20 at the same time. Therefore, the first pattern set 10 and the second pattern set 20 may be formed, in order of precedence, using a double patterning method.

FIGS. 2A-2D are plan views that illustrate methods of forming patterns in a semiconductor device according to some embodiments of the present invention. FIGS. 3A-3G are cross-sectional views that further illustrate the methods of forming patterns in a semiconductor device of FIGS. 2A-2D.

A section taken along the line I-I' of FIGS. 2A-2D corresponds to region I of FIGS. 3A-3G, and a section taken along the line II-II' of FIGS. 2A-2D corresponds to region II of FIGS. 3A-3G. Region III of FIGS. 3A-3G corresponds to a peripheral circuit region, but is not shown in FIGS. 2A-2D.

Figure 2A:
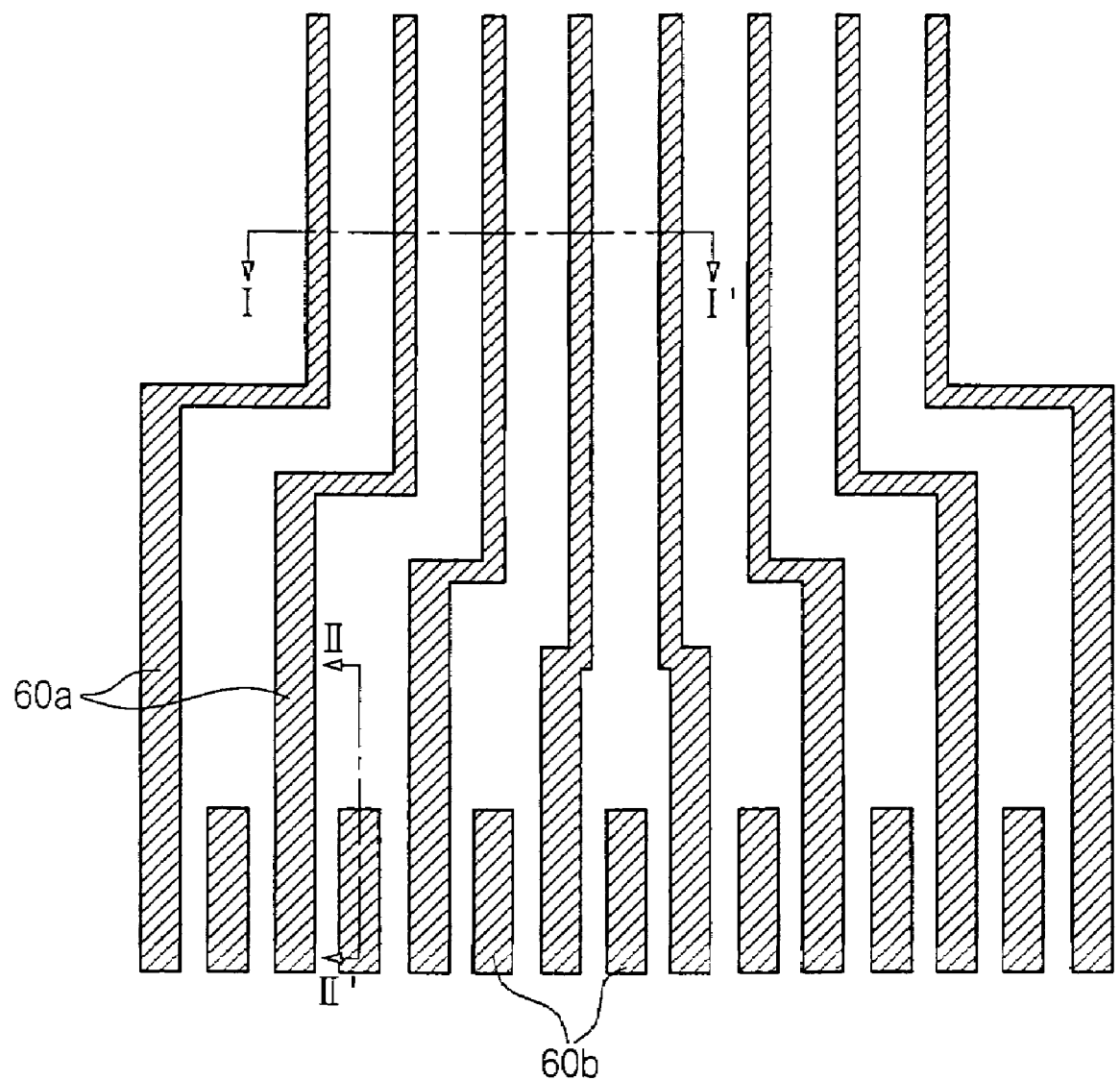
FIGS. 2A-2D are plan views that illustrate methods of forming patterns in a semiconductor device according to some embodiments of the present invention.

Referring to FIGS. 2A and 3A, a lower layer is formed on a semiconductor substrate 50. A first region, a second region, and a third region are defined on the semiconductor substrate 50. A cell array region may be defined as the first region. An interface region between the cell array region and the peripheral circuit region may be defined as the second region and the peripheral circuit region may be defined as the third region.

A semiconductor device in which a cell array region is defined as the first region, and interface region is defined as the second region, and a peripheral circuit region is defined as the third region, in accordance with some embodiments of the present invention, will now be described.

The cell array region, which is a region in which memory cells of a memory device are arranged, may be a cell region of a charge trap flash memory device. The lower layer of the first region (region A and region I) and the second region (region B and region II) may include a charge trap insulating layer 52a and a first gate layer 54a formed on the charge trap insulating layer 52a. A gate insulating layer 52b and a second gate layer 54b may be used as the lower layer of the preferable circuit region III. A high conductive layer 56 is further formed on the first gate layer 54a and the second gate layer 54b. The charge trap insulating layer 52a is configured with a tunnel insulating layer, a charge trap layer, and a blocking insulating layer, which are stacked sequentially. The blocking insulating layer may comprise a material that has a dielectric constant that is higher than that of the tunnel insulating layer. For example, the charge trap insulating layer 52a may comprise a thermal oxide layer, a silicon nitride layer, and/or an aluminum oxide layer, which are stacked sequentially. The first gate layer 54a may comprise a material that has a work function that is greater than that of the blocking insulating layer. For example, a tantalum nitride layer that contains a metallic material may be used as the first gate layer 54a. A silicon oxide layer may be used as the gate insulating layer 52b and a polysilicon layer may be used as the second gate layer 54b. A tungsten and/or tungsten nitride layer may be used as the high conductive layer 56.

A mask insulating layer may be further formed on the lower layer. The silicon oxide layer may be used as the mask insulating layer 58. First patterns 60a and second patterns 60b are formed on the lower layer. When the mask insulating layer 58 is formed, the first patterns 60a and the second patterns 60b may be formed on the mask insulating layer 58. The first patterns 60a are arranged with a pitch that extends to the cell array region (region A) and the interface region (region B). The second patterns 60b are arranged on the interface region (region B) with a pitch and also alternately arranged with the first patterns 60a. Fourth patterns 62 may be arranged on the peripheral circuit region (region III).

Figure 2B:
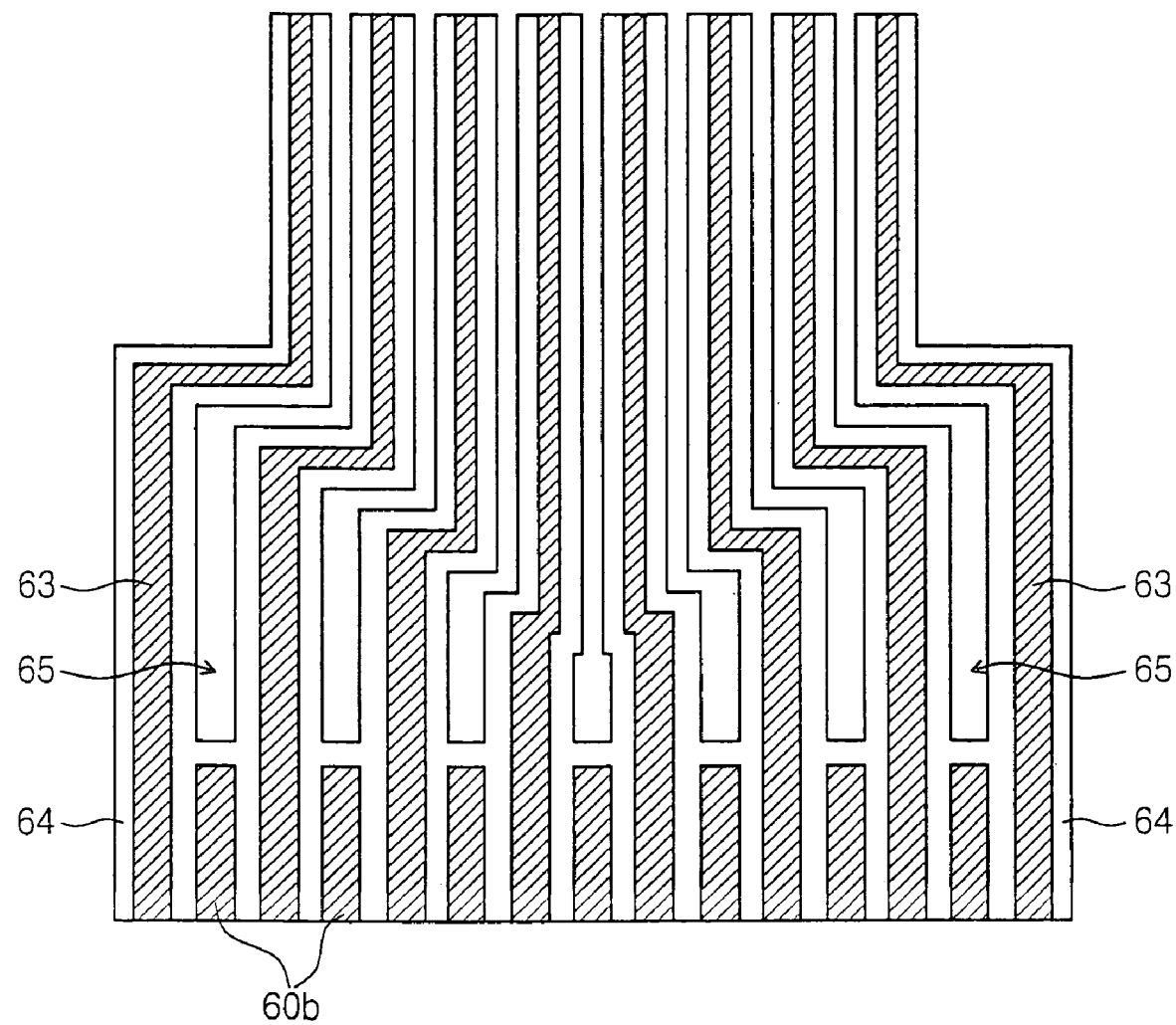
Figure 3B:
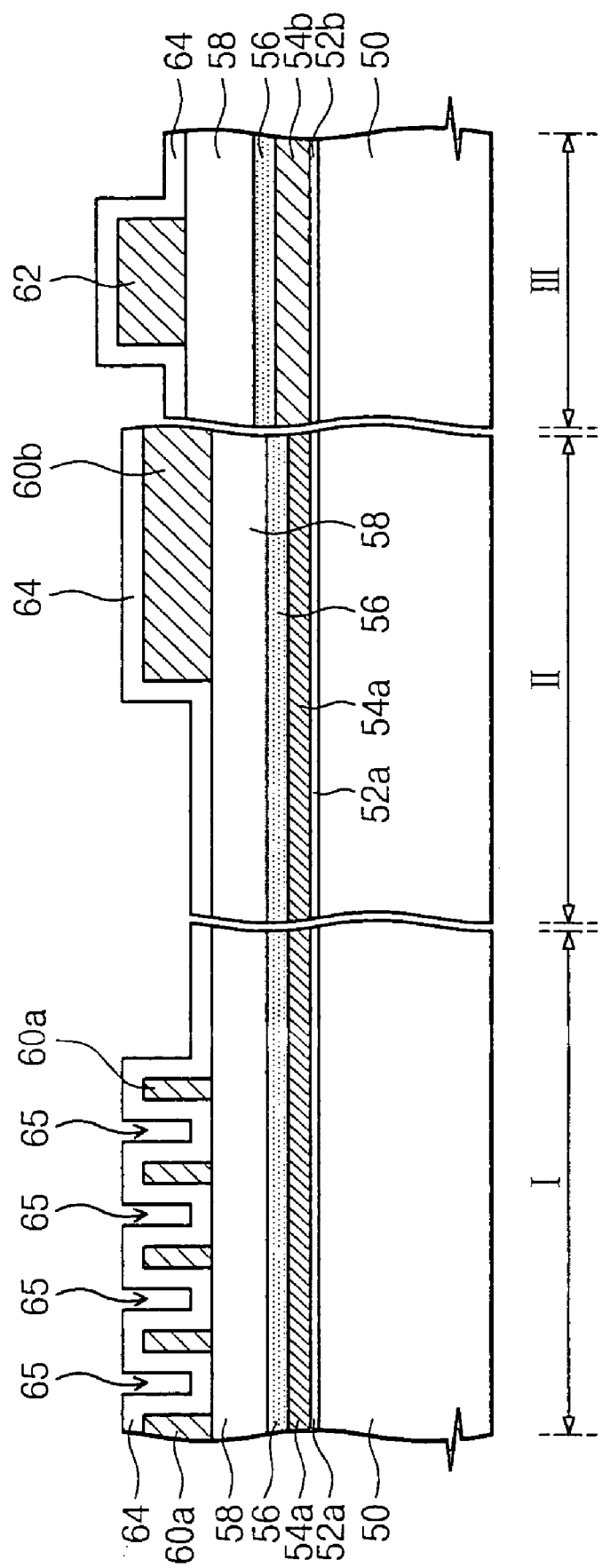

Referring to FIGS. 2B and 3B, a space insulating layer 64 is formed on an entire surface of the semiconductor substrate. The space insulating layer 64 covers the first patterns 60a, the second patterns 60b, and the fourth patterns 62. The space insulating layer 64 covers the semiconductor substrate along an underlying profile. Accordingly, gap regions 65 between the first patterns 60a may be formed on the semiconductor substrate. The gap regions are alternately arranged with the first patterns 60a and correspond to the second patterns 60b. That is, boundaries of the gap regions are limited to the space insulating layer 64, which continuously covers sidewalls of the first patterns 60a and the second patterns 60b. As illustrated in FIGS. 2B and 3B, the gap regions 65 may be parallel to the first patterns 60a, and the second patterns 60b may be disposed in extensions of the gap regions 65.

Figure 2C:
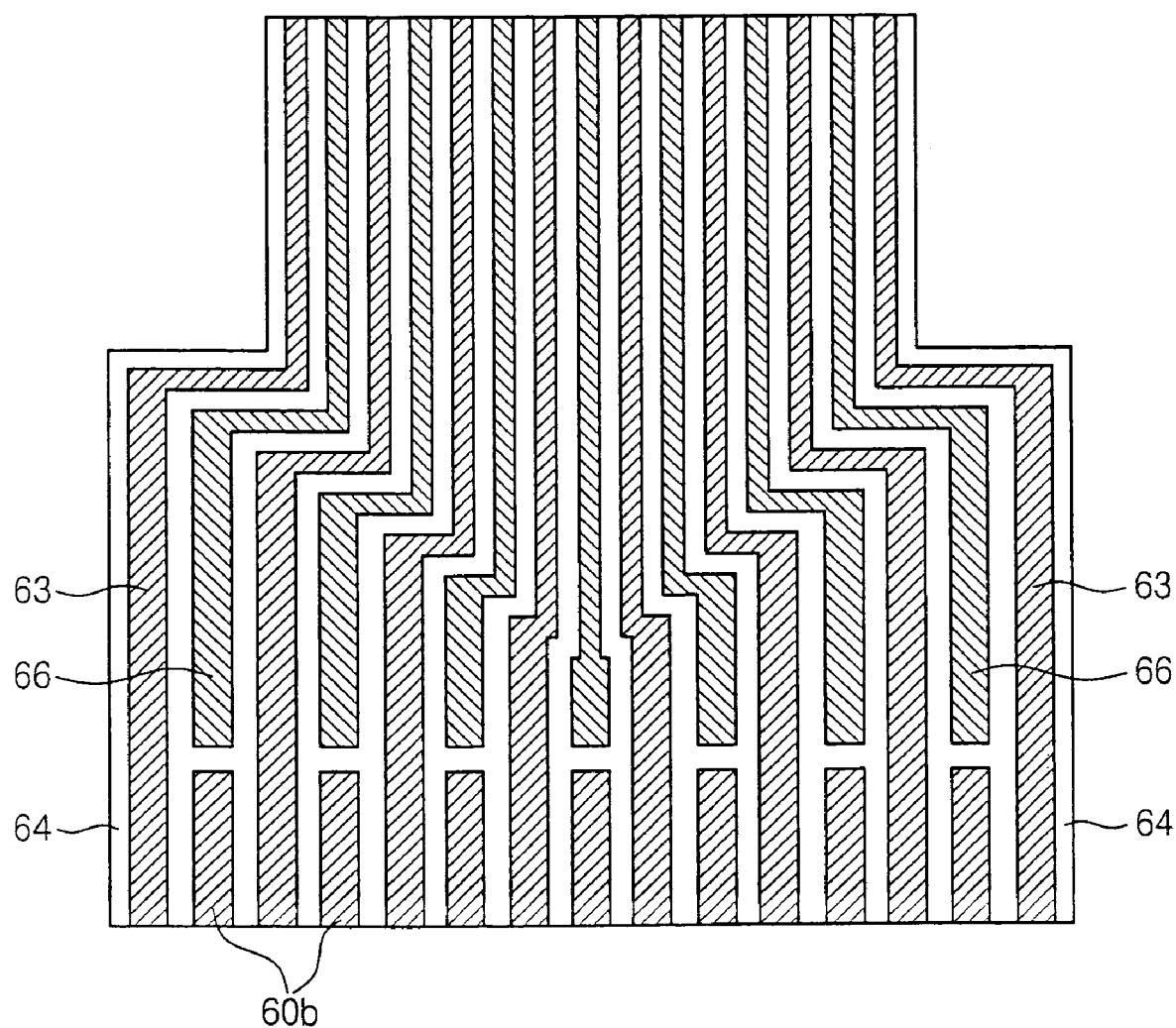

Referring to FIGS. 2C and 3C, third patterns 66 are formed within the respective gap regions 65. The third patterns 66 are alternately arranged with the first patterns 60a. The third patterns 66 may be extended parallel to the first patterns 60a and correspond to the second patterns 60b. Therefore, the second patterns 60b may be arranged on extensions of the third patterns 66, respectively. A material 66a used for the third patterns 66 may remain around the fourth patterns 62 of the peripheral circuit region III.

Figure 3D:
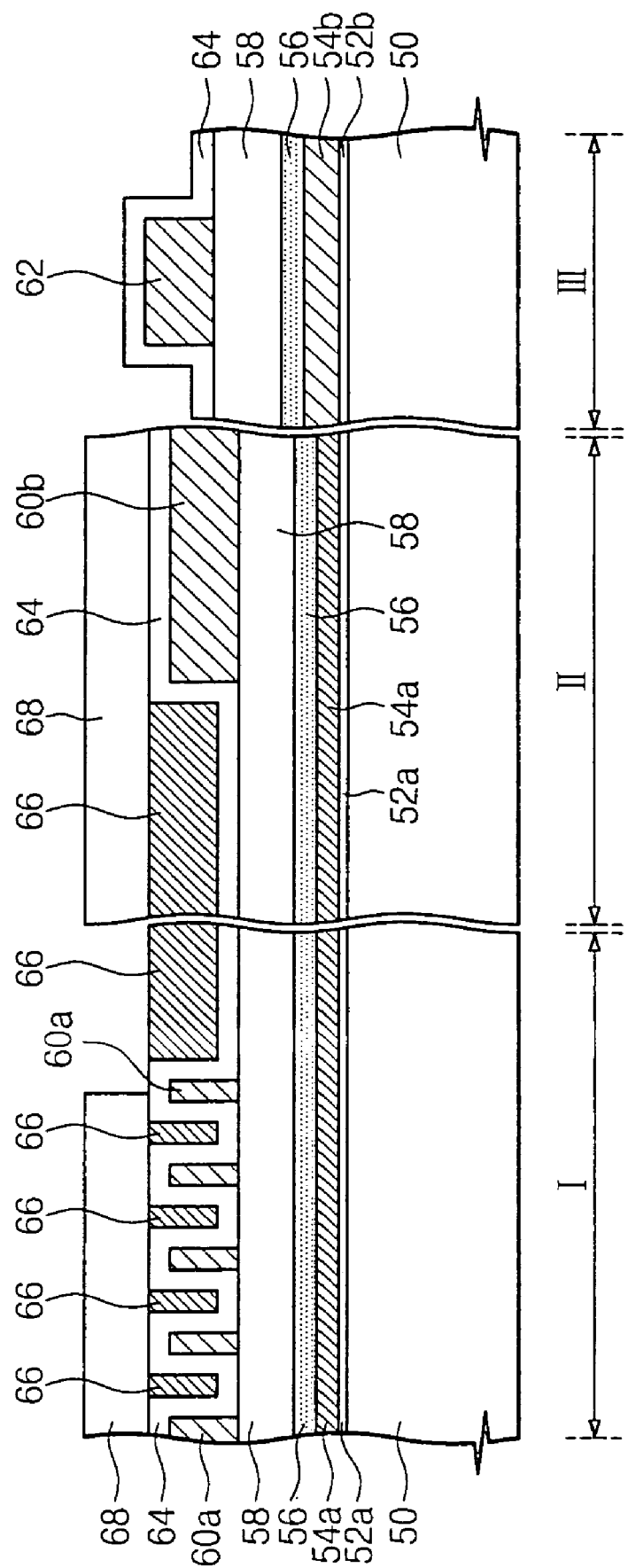

Referring to FIG. 3D, first etch mask patterns 68 are formed on the semiconductor substrate to remove the material 66a left around the fourth patterns 62 of the peripheral circuit region III. The material 66a may also be removed from other regions where it is undesired.

Figure 2D:
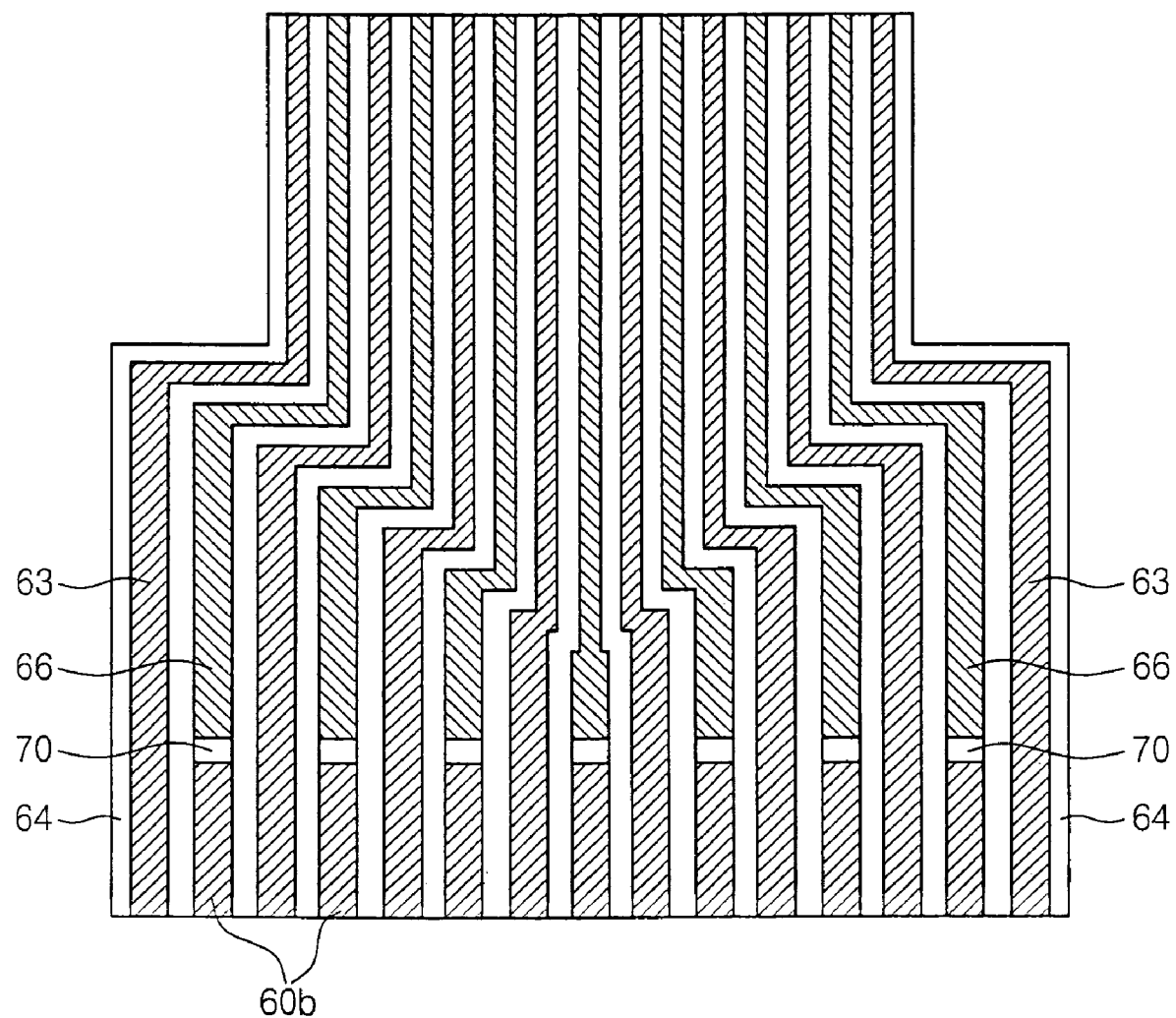
Figure 3E:
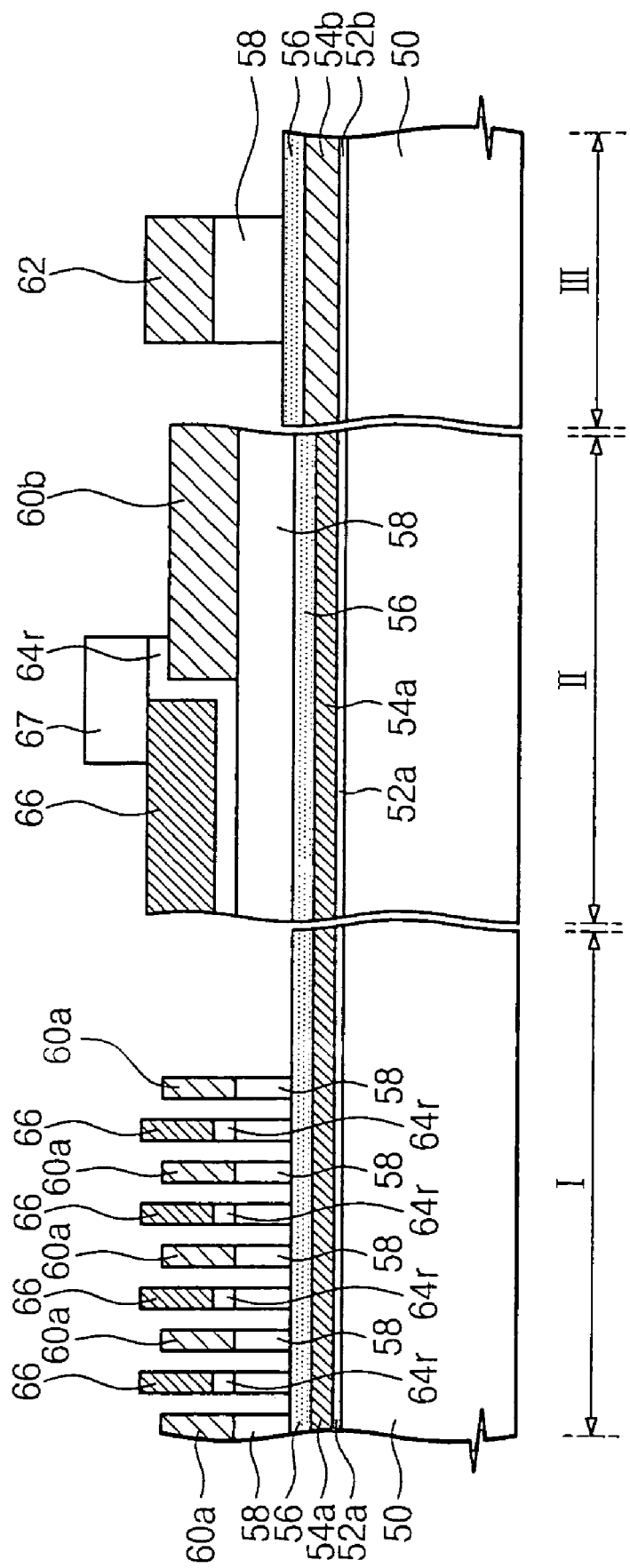

Referring to FIGS. 2D and 3E, second etch mask patterns 70 are formed that cover the space insulating layer 64 between the second patterns 60b and the third patterns 66. The second etch mask patterns 70 may be used as photoresist patterns. The second eth mask patterns 70 are formed to selectively leave the space insulating layer 64 between sidewalls of the second patterns 60b and sidewalls of the third patterns 66. The space insulating layer 64 formed on the first patterns 60a, the second patterns 60b, and the third patterns 66 are etched using the second etch mask patterns 70. The space insulating layer 64 between the first patterns 60a and the third patterns 66 and between the first patterns 60a and the second patterns 60b is etched.

The mask insulating layer 58 is subsequently etched with the space insulating layer 64 to form mask insulating patterns. The mask insulating layer patterns include a first insulating layer pattern set 54p1 that is self-aligned on the first patterns 60a, and a second insulating layer pattern set 54p2 that is self-aligned on the second patterns 60b and the third patterns 66. The second insulating layer pattern set 54p2 is arranged on the second patterns 60b, the third patterns 66 and the space insulating layer 64 between the second patterns 60b and the third patterns 66 to have a continuous structure. The self-aligned mask insulating layer patterns 54p may also be formed on the fourth patterns 66a in the peripheral circuit region III.

Referring to FIG. 3F, the high conductive layer 56 that forms the lower layer may be etched after the mask insulating layer 58 is etched. Therefore, a portion of the first gate layer 54a is exposed in the cell region I and the interface region II, and a portion of the second gate layer 54b may be exposed in the peripheral circuit region III.

The first patterns 60a, the second patterns 60b, the third patterns 66, and the fourth patterns 62 may comprise a material that has an etch selectivity with respect to the mask insulating layer 58 and the space insulating layer 64. In some embodiments, the first patterns 60a, the second patterns 60b, the third patterns 66, and the fourth patterns 62, may comprise a material that can be etched together with the second gate layer 54b.

Referring to FIG. 3G, the second patterns 60b, the third patterns 66, the fourth patterns 62 and the second gate layer 54b are etched using the mask insulating layer patterns 54p, 54p1, and 54p2 as an etch stop layer to form gate patterns 72c. The first gate layer 56b is etched together with the second gate layer 54b using the mask insulating layer patterns 54p, 54p1, and 54p2 as the etch stop layer or etched using the mask insulating layer patterns 54p, 54p1, and 54p2 as the etch mask to form a first cell gate pattern set 72a and a second cell gate pattern set 72b, which are alternately arranged in the cell region I and the interface region II.

As a result, lines are arranged in the cell region I and the interface region II as illustrated in FIG. 1. Although a line pitch of the cell region I is different from a line pitch of the interface region II, the lines of the two regions can be connected to each other.

Figure 4A:
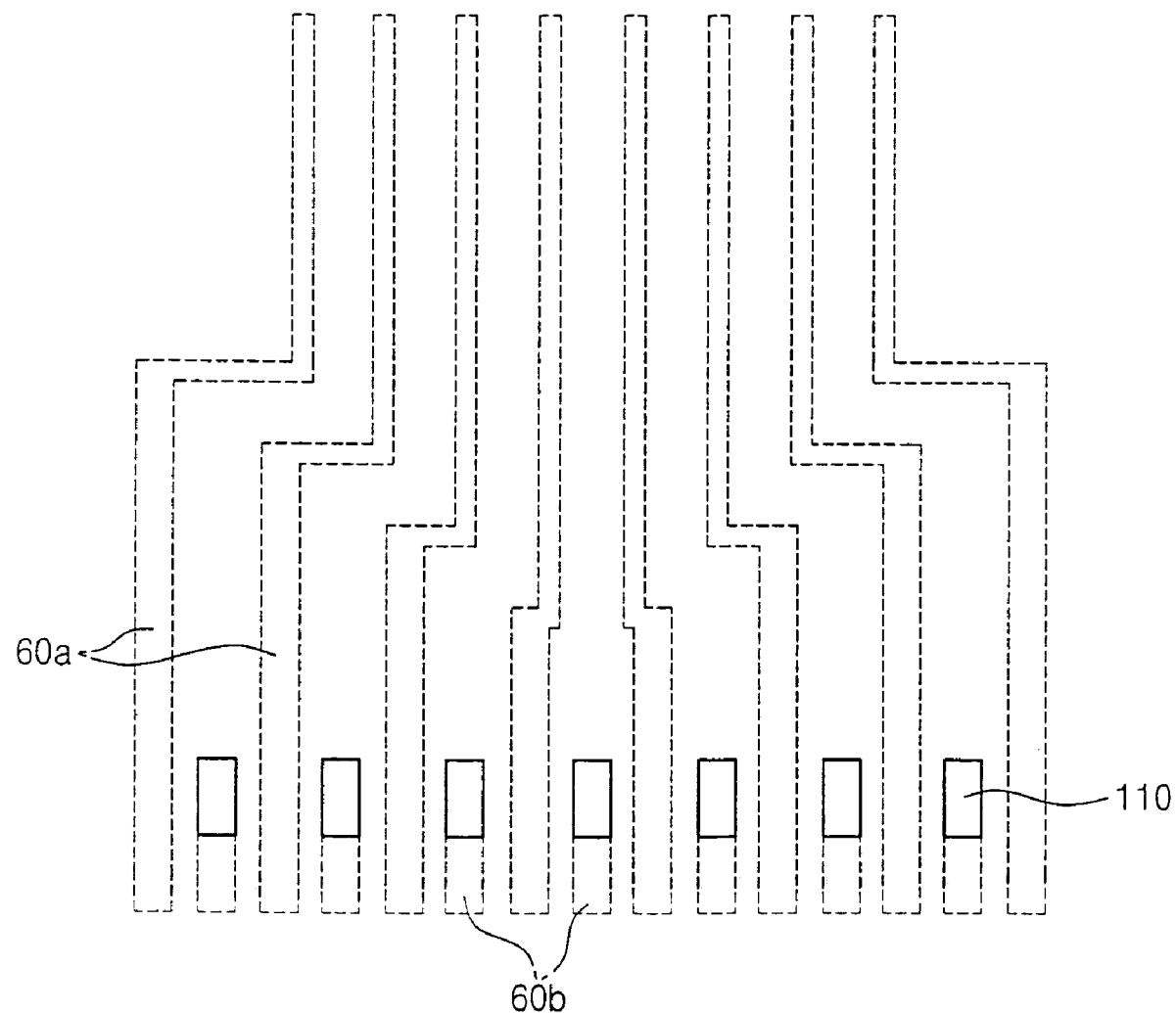
FIGS. 4A-4B are plan views that illustrate methods of forming patterns in a semiconductor device according to further embodiments of the present invention.
Figure 4B:
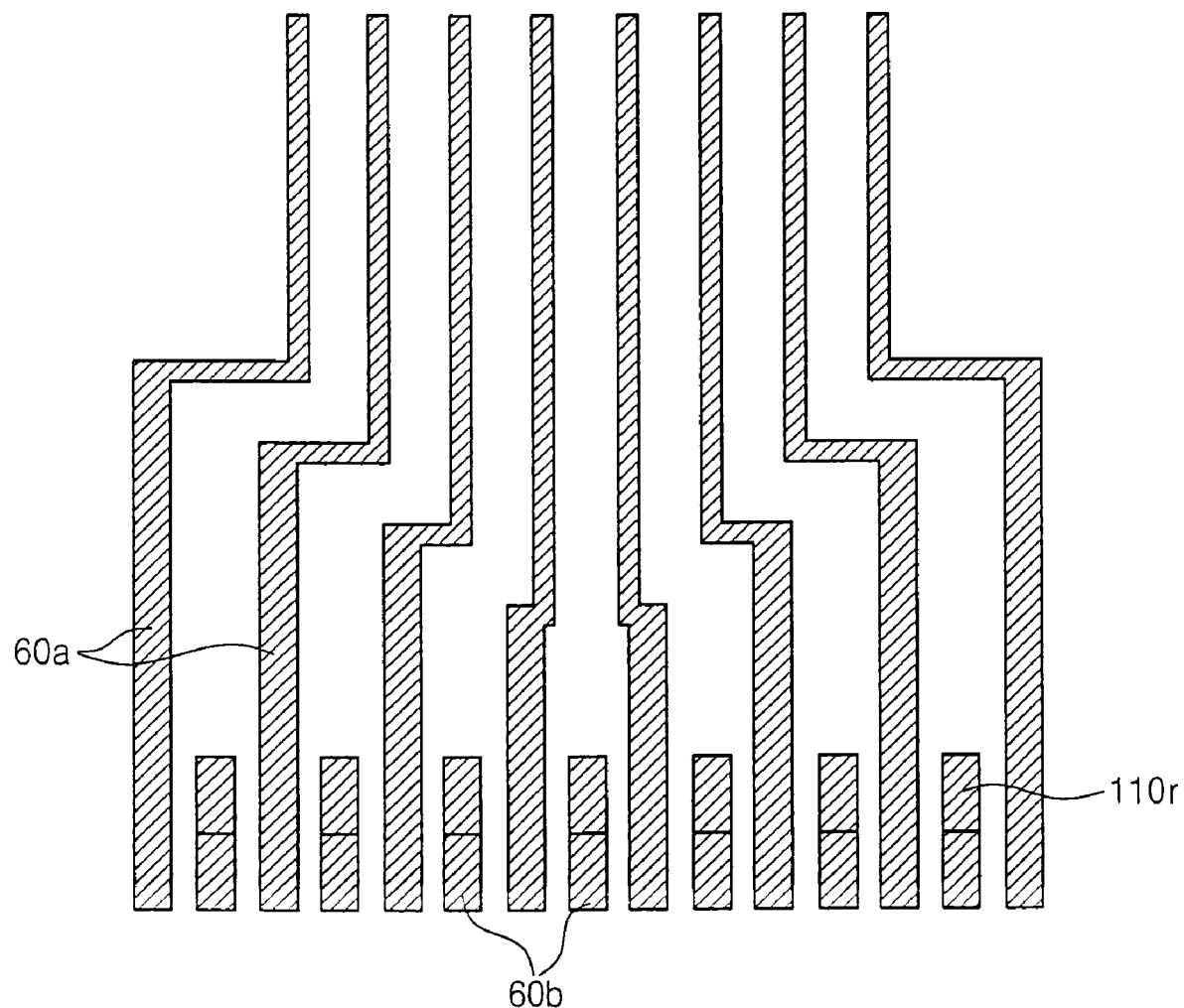

FIGS. 4A-4B are plan views that illustrate methods of forming patterns in a semiconductor device according to further embodiments of the present invention. FIGS. 5A-5E are cross-sectional views that further illustrate the methods of forming patterns in a semiconductor device of FIGS. 4A-4B.

Figure 5A:
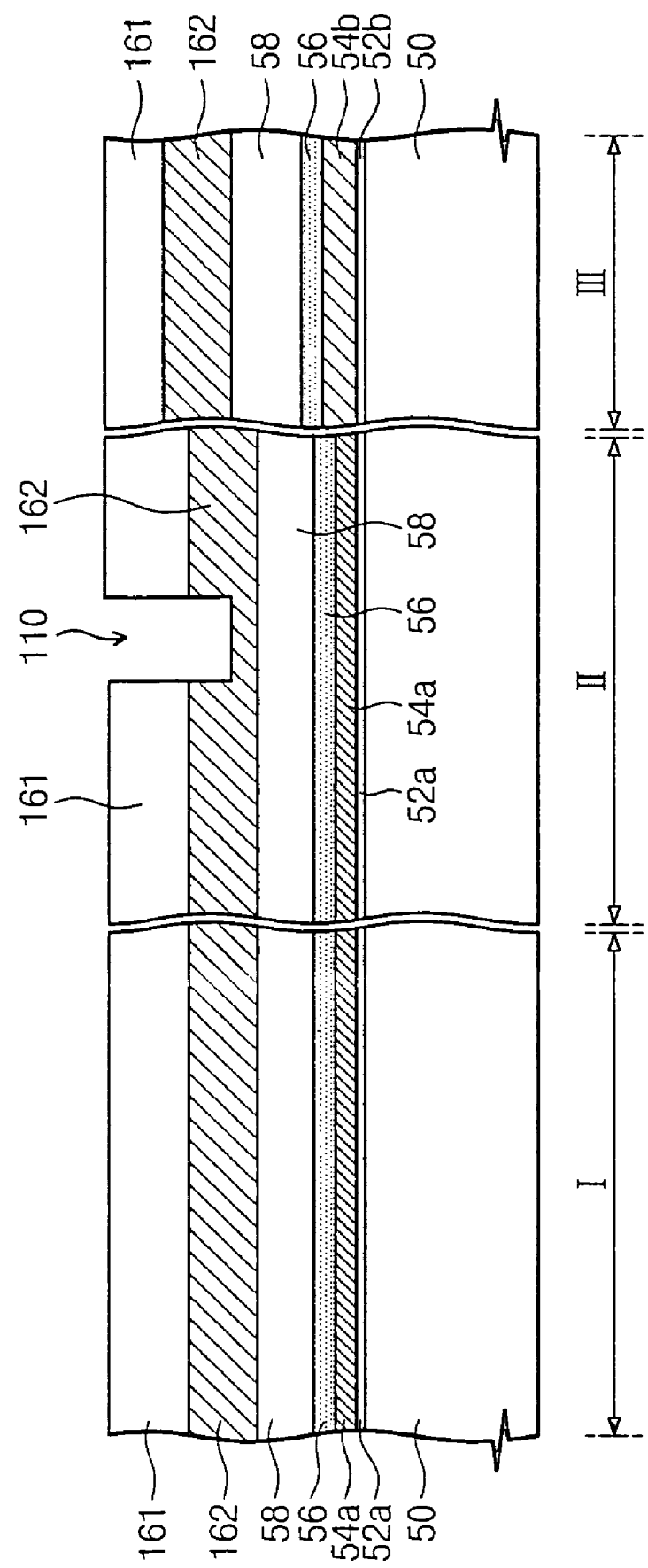

Referring to FIGS. 4A and 5A, similar to the embodiments discussed above, the first patterns 60a and the second patterns 60b are formed on a semiconductor substrate. The second patterns 60b, however, have recessed end portions. A mask layer 162 is formed for use in forming the first patterns 60a and the second patterns 60b, and first photoresist patterns 161 are formed for use in forming the recess regions 110 on the mask layer 162. The mask layer 162 is etched using the photoresist patterns 161 as an etch mask so that the mask layer 162 remains with a desired thickness. The recess regions 110 are formed on portions corresponding to the end portions of the second patterns 60a.

Figure 5B:
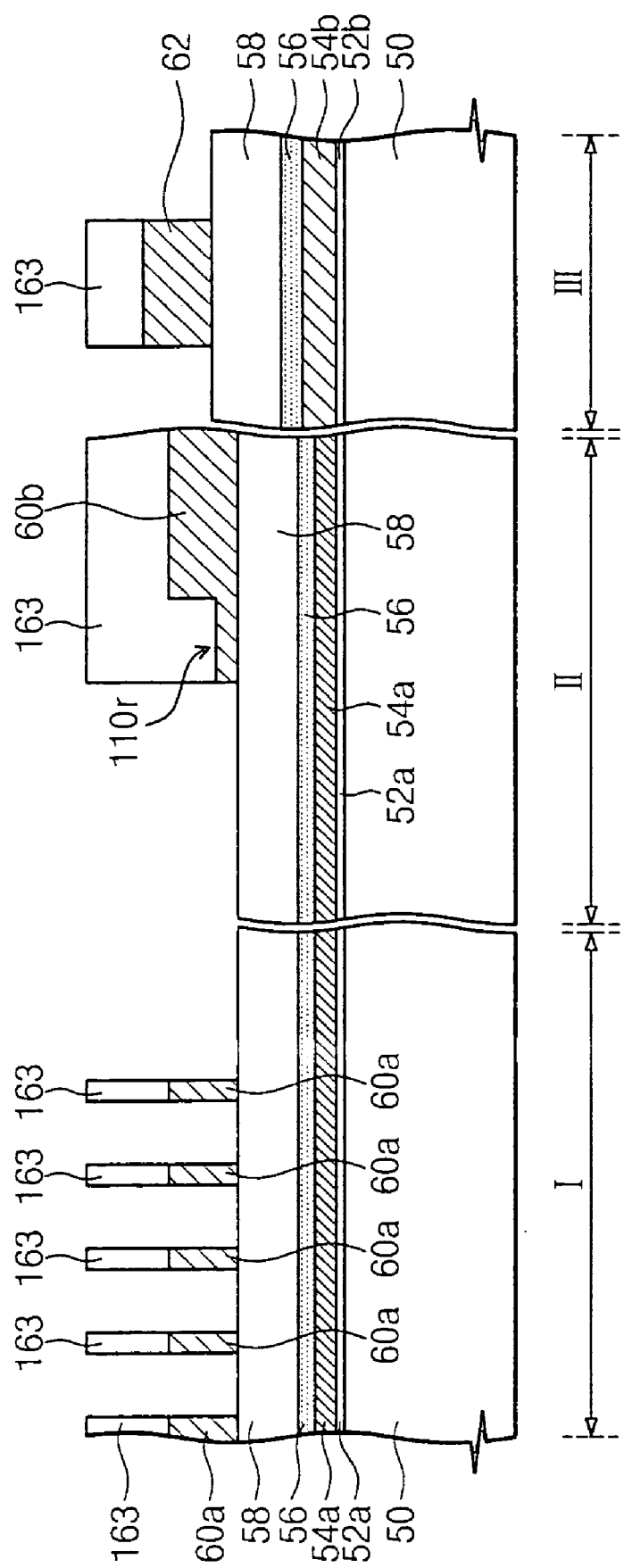

Referring to FIGS. 4B and 5B, the first photoresist patterns 161 are etched to form second photoresist patterns 163 for patterning the first patterns 60a, the second patterns 60b, and the fourth patterns 62. The mask layer 162 is etched using the second photoresist patterns 161 as an etch mask to form the first patterns 60a, the second patterns 60b, and the fourth patterns 62. The second patterns 60b may have recessed end portions 110r because the recess regions 110 are covered with the second photoresist patterns 163.

Figure 5C:
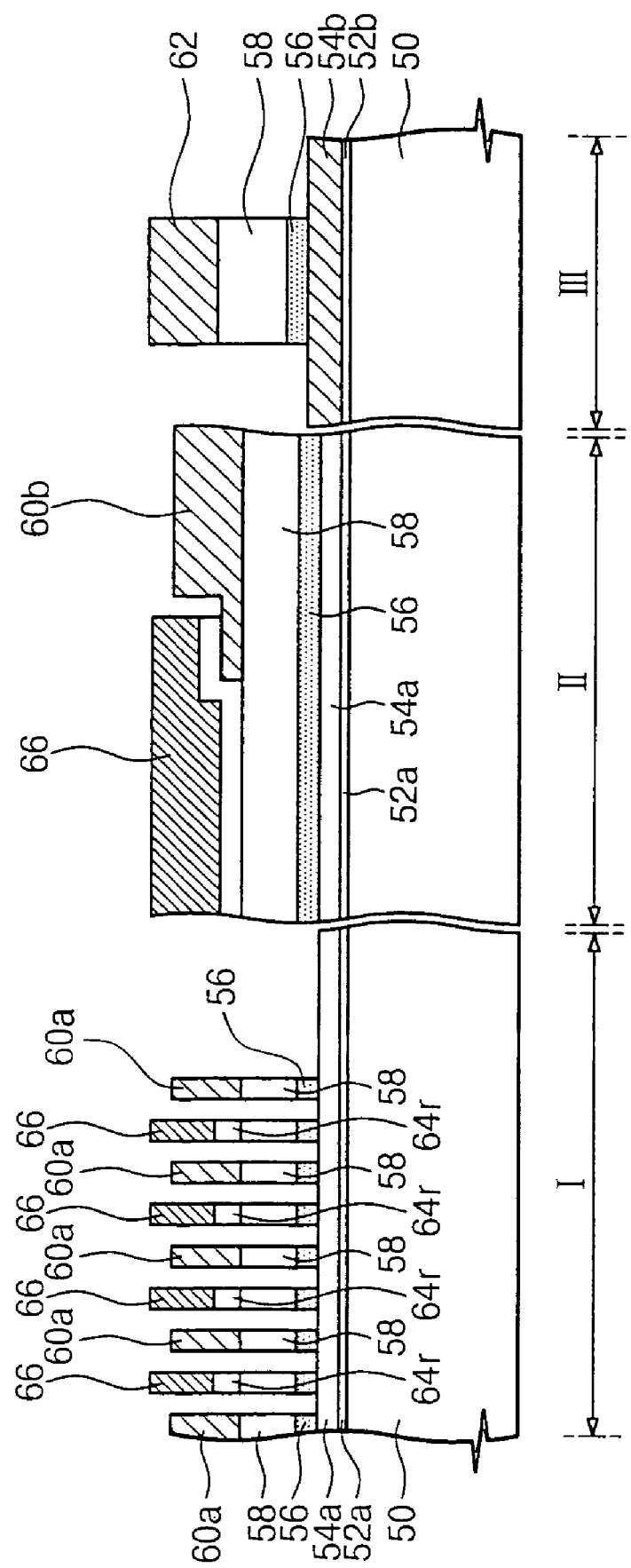

Referring to FIG. 5C, similar to the embodiments discussed above, a space insulating layer 64 having gap regions that covers the first patterns 60a, the second patterns 60b, and the fourth patterns 62 is formed. The third patterns 66 are formed in the gap regions. As illustrated in FIG. 5C, the second patterns 60b have recessed end portions 110r. Therefore, the third patterns 66 have overlapped portions 166 on the recessed end portions 110r.

Referring to FIG. 5D, the space insulating layer 64 formed on the first patterns 60a, the second patterns 60b, and the third patterns 66 is etched using the third patterns 66 as the etch mask. The space insulating layer 64 between the first patterns 60a and the third patterns 66 and between the first patterns 60a and the second patterns 60b is etched. The second patterns 60b and the third patterns 66 overlap each other. Thus, during etching of the space insulating layer 64, the space insulating layer 64 under the third patterns 66 is not etched.

The mask insulating layer patterns 54p are formed by continually etching the mask insulating layer 58 with the space insulating layer 64. The mask insulating layer patterns 54p include the first insulating layer pattern set 54p1 self-aligned on the first patterns 60a and the second insulating layer pattern set 54p2 self-aligned on the second patterns 60b and the third patterns 66. The second insulating layer pattern set 54p2 is arranged on the second patterns 60b, the third patterns 66, and the space insulating layer 64 between the second patterns 60b and the third patterns 66 so as to have a continuous structure. The mask insulating layer patterns 54p self-aligned on the fourth patterns 66a may also be formed on the peripheral circuit region III.

According to the embodiments discussed above with respect to FIGS. 4A-4B and 5A-5E, patterns in the cell array region and the interface region can be connected using overlapped portions of the second patterns 60b with the third patterns 66 without an additional etch mask.

According to some embodiments of the present invention, patterns having different pitches can be connected using a double patterning technique. For example, patterns having a small pitch are formed in a region using a double patterning technique and patterns having a larger pitch are formed in a region using a single patterning technique to thereby connect the patterns of the two regions.

Advantageously, some embodiments of the present invention may allow the integration density of a cell array region to be improved, while a peripheral circuit region uses an existing layout. This may allow the time and effort involved in changing the layout of the peripheral circuit region to be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

That which is claimed:

1. A method of forming patterns in a semiconductor device, comprising:

defining a lower layer that comprises a first region and a second region on a semiconductor substrate;

forming first patterns with a first pitch that extend to the first and second regions;

forming second patterns with a second pitch in the second region that are alternately arranged with the first patterns;

forming a space insulating layer that covers the first and second patterns and comprises gap regions that are alternately arranged with the first patterns so as to correspond with the second patterns;

forming third patterns that correspond to the second patterns in the gap regions, respectively;

etching the space insulating layer between the first and second patterns and between the first and third patterns, such that the space insulating layer remains between the second patterns and the third patterns; and etching the lower layer using the first, second, and third patterns and the remaining space insulating layer between the second and third patterns as an etching mask.

2. The method of claim 1, wherein the lower layer comprises a charge trap insulating layer and a first gate layer that is formed on the charge trap insulating layer.

3. The method of claim 2, wherein the first gate layer comprises a metal nitride layer.

4. The method of claim 2, wherein the first gate layer comprises a tantalum nitride layer that is formed on the charge trap insulating layer.

5. The method of claim 1, wherein the first region is a cell array region and the second region is a decoder region that is adjacent to the cell array region;
  wherein the lower layer comprises a charge trap insulating layer and a first gate layer that is formed on the charge trap insulating layer.

6. The method of claim 1, further comprising:
  forming a mask insulating layer on the lower layer before forming the first and second patterns;
  forming etch mask patterns that cover the space insulating layer between the second and third patterns before etching the space insulating layer; and
  etching the space insulating layer and the mask insulating layer using the etch mask patterns and the first, second, and third patterns as an etch mask so as to form mask insulating layer patterns.

7. The method of claim 6, wherein the mask insulating layer patterns comprise alternately arranged first and second insulating layers, the first insulating layers corresponding to the first patterns and the second insulating layers corresponding to a structure of which the second and third patterns are connected.

8. The method of claim 6, further comprising:
  defining a third region on the semiconductor substrate;
  wherein a lower layer of the third region comprises a gate insulating layer and a second gate layer that is formed on the gate insulating layer.

9. The method of claim 8, further comprising:
  forming fourth patterns on the third region;
  wherein the first, second, third, and fourth patterns comprise a same material as the second gate layer.

10. The method of claim 9, wherein etching the space insulating layer and the mask insulating layer comprises:
  etching the space insulating layer and the mask insulating layer using the etch mask patterns and the first, second, third, and fourth patterns as an etch mask so as to form the mask insulating layer patterns; and
  etching the second gate layer together with the first, second, third, and fourth patterns so as to form gate electrodes that are aligned with the mask insulating layer patterns under the fourth patterns.

11. The method of claim 1, further comprising, before forming the first and second patterns:
  forming a mask insulating layer on the lower layer;
  forming a mask pattern layer on the mask insulating layer; and
  forming recess regions in the mask pattern layer corresponding to end portions of the second patterns, such that the mask pattern layer has a recess thickness in the recess regions;
  wherein etching the space insulating layer comprises etching the mask pattern layer so as to form the second patterns such that the first patterns and the end portions of the second patterns are recessed to the recess thickness.

12. The method of claim 11, wherein forming the third patterns comprises forming the third patterns such that the third patterns overlap the end portions of the second patterns.

13. The method of claim 12, further comprising:
  etching the mask insulating layer to form mask insulating layer patterns, the mask insulating layer patterns comprising alternately arranged first and second insulating layer patterns, the first insulating layer patterns being self-aligned with the first patterns, and the second insulating layer patterns being self-aligned with a structure of which the second and third patterns are connected.

14. The method of claim 13, wherein etching the space insulating layer comprises etching the space insulating layer between end portions of the second patterns and the third patterns until reaching the overlap of the third patterns with the end portions of the second patterns.

* * * * *